United States Patent [19]
Chan et al.

[11] Patent Number: 5,273,924
[45] Date of Patent: Dec. 28, 1993

[54] METHOD FOR FORMING AN SRAM BY MINIMIZING DIFFUSION OF CONDUCTIVITY ENHANCING IMPURITIES FROM ONE REGION OF A POLYSILICON LAYER TO ANOTHER REGION

[75] Inventors: Hiang C. Chan; Pierre C. Fazan; Bohr-Winn Shih, all of Boise, Id.

[73] Assignee: Micron Technology, Inc., Boise, Id.

[21] Appl. No.: 52,364

[22] Filed: Apr. 23, 1993

Related U.S. Application Data

[62] Division of Ser. No. 753,355, Aug. 30, 1991, Pat. No. 5,236,856.

[51] Int. Cl.⁵ .................................. H01L 21/266
[52] U.S. Cl. .................................. 437/46; 437/24; 437/918
[58] Field of Search ............... 437/24, 27, 46, 47, 437/60, 149, 150, 904, 918, 959; 148/DIG. 31, DIG. 40, DIG. 136, DIG. 157

[56] References Cited

U.S. PATENT DOCUMENTS

| | | | |
|---|---|---|---|
| 4,045,249 | 8/1977 | Hotta | 437/24 |
| 4,851,359 | 7/1989 | Boudou et al. | 437/24 |
| 4,965,214 | 10/1990 | Choi et al. | 437/918 |
| 5,034,797 | 7/1991 | Yamanaka et al. | 257/904 |
| 5,104,818 | 4/1992 | Silver | 437/46 |
| 5,185,285 | 2/1993 | Hasaka | 437/918 |
| 5,198,382 | 3/1993 | Campbell et al. | 437/46 |

FOREIGN PATENT DOCUMENTS 3-24735  2/1991  Japan.

Primary Examiner—Brian E. Hearn
Assistant Examiner—Chandra Chaudhari
Attorney, Agent, or Firm—Wells, St. John, Roberts, Gregory & Matkin

[57] ABSTRACT

A polysilicon layer is provided with a p-type impurity, and masked with an oxide mask to define a p-type region of the polysilicon layer. A second impurity is then provided into first unmasked regions of the polysilicon layer. A second oxide mask is deposited and anisotropically etched to form spacers adjacent to the first oxide mask. The spacers define two diffusion barrier regions of the polysilicon layer adjacent to the p-type region. An n-type impurity is then provided into second unmasked regions of the polysilicon layer to form two n-type regions adjacent the diffusion barrier regions. The diffusion barrier regions prevent cross diffusion of the p-type and the n-type impurities within the polysilicon layer, while also being of sufficient dimensions to permit normal p/n operations.

5 Claims, 5 Drawing Sheets

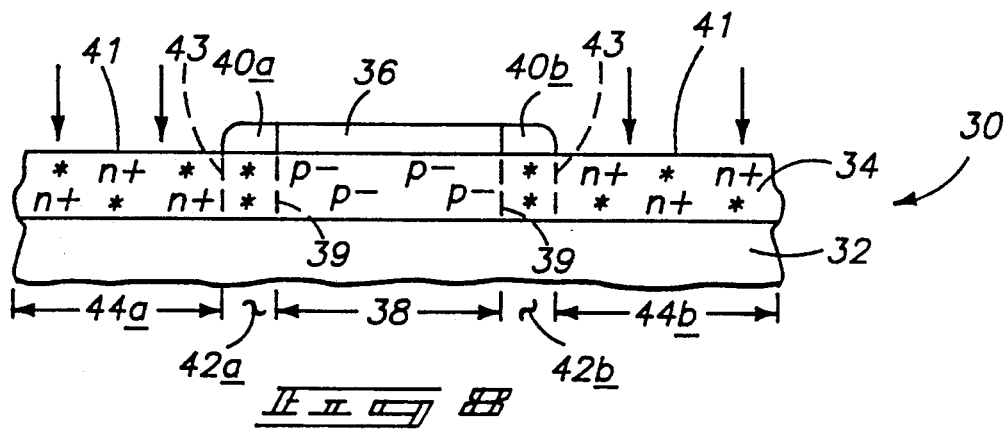
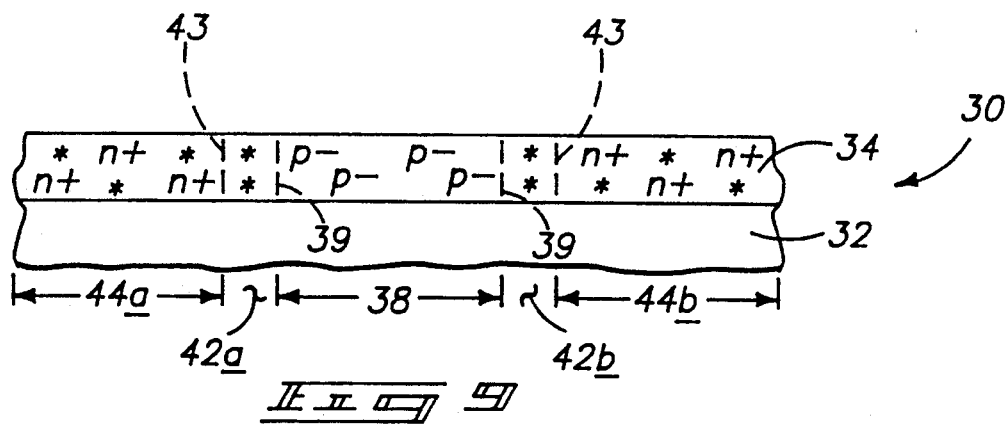

METHOD FOR FORMING AN SRAM BY MINIMIZING DIFFUSION OF CONDUCTIVITY ENHANCING IMPURITIES FROM ONE REGION OF A POLYSILICON LAYER TO ANOTHER REGION

RELATED PATENT DATA

This patent resulted from a divisional application of U.S. application Ser. No. 07/753,355, filed Aug. 30, 1991 which issued as U.S. Pat. No. 5,236,856 on Aug. 17, 1993.

TECHNICAL FIELD

The present invention relates to a method for forming semiconductor devices, and more particularly, to a method for minimizing diffusion of conductivity enhancing impurities from one region of a polysilicon layer into another region.

BACKGROUND OF THE INVENTION

A common semiconductor configuration involves a single polysilicon layer having two n-type doped regions separated by a p-type region (i.e., an n/p/n configuration). This configuration is typically employed in back-to-back diode load resistors in a Static Random Access Memory (SRAM) cell, although other applications exist.

To construct the n/p/n configuration, a polysilicon layer is first doped with a p-type impurity. Next, an oxide layer is formed on the polysilicon layer and etched to define a mask over a central p-type impurity region. An n-type impurity is then implanted into the unmasked regions of the polysilicon layer. Generally, the concentration of the n-type impurity (n+) is considerably greater than the concentration of the p-type impurity (p−), resulting in an n+/p−/n+ configuration.

A problem arises during the construction of the n+/p−/n+ configuration in that the n+ impurity diffuses into the p− impurity region along the polysilicon grain boundaries. Conventional SRAM cells employ back-to-back diode resistors having a length of approximately five microns. On this scale, the diffusion of the n+ impurity does not cause a significant problem. However, as new technology enables the construction of smaller scale SRAM cells, the back-to-back diode resistor is expected to have a length of approximately two microns or less. On this smaller scale, the n+ impurity diffusion into the p− impurity region poses a significant problem.

One conventional approach to solving the diffusion problem is illustrated in FIGS. 1–4. FIG. 1 illustrates a wafer fragment 10 comprising an underlying layer 12 and a polysilicon layer 14. Polysilicon layer 14 is everywhere doped with a p−impurity. As shown in FIG. 2, oxygen is implanted into polysilicon layer 14. Next, an oxide layer is deposited on polysilicon layer 14 and etched to form an oxide mask 16 as shown in FIG. 3. Oxide mask 16 defines a central p− region 18.

An n+ impurity is then implanted into the unmasked regions of polysilicon layer 14. Oxide mask 16 prevents the n+ impurity from being implanted into central p− region 18, thereby defining boundaries 20 between the p− doped polysilicon and the n+ doped polysilicon. The oxygen restricts the diffusion of the n+ impurity into p− region 18. Thereafter, oxide mask 16 is removed. As shown in p− region 18. Thereafter, oxide mask 16 is removed. As shown in FIG. 4, the resultant polysilicon layer 14 comprises three regions: two n+ regions 22a and 22b separated by a p− region 18.

The above described method has a serious drawback in that the implanted oxygen is an insulating material which can have a significant detrimental effect within the p− region 18 and correspondingly on the desired effectiveness of the resistor. This implantation can damage the p− region 18, and may detrimentally impact the overall conductivity/resistance characteristics of the n+/p−/n+ device.

These and other drawbacks associated with the prior art are undesired and should be obviated.

BRIEF DESCRIPTION OF THE DRAWINGS

One or more preferred embodiments of the invention are described below with reference to the accompanying drawings.

FIG. 8 diagrammatically illustrates a processing step in a method for forming an n/p/n configuration in a polysilicon layer which occurs subsequent to the step illustrated in FIG. 6;

FIG. 9 diagrammatically illustrates a processing step in a method for forming an n/p/n configuration in a polysilicon layer which occurs subsequent to the step illustrated in FIG. 8.

DETAILED DESCRIPTION OF THE PREFERRED EMBODIMENTS

This disclosure of the invention is submitted in furtherance of the constitutional purposes of the Patent Laws "to promote the progress of science and useful arts" (Article I, Section 8).

According to one aspect of the invention, a method for minimizing diffusion of conductivity enhancing impurities from one region of a wafer into another region comprises the steps of:

providing a polysilicon layer having a first impurity, the first impurity being of a first conductivity type and being provided to a first concentration;

masking a first selected portion of the polysilicon layer;

providing a second impurity into unmasked regions of the polysilicon layer to a second concentration;

masking a second selected portion of the polysilicon layer adjacent the first selected portion; and providing a third impurity of a second conductivity type into unmasked regions of the polysilicon layer to a third concentration to define a diffusion barrier region between first conductivity type polysilicon and second conductivity type polysilicon, the diffusion barrier region restricting cross diffusion of the first and second conductivity type impurity within the polysilicon layer.

The preferred second impurity is one or more of nitrogen, oxygen, or germanium. Preferably, the first conductivity type is a p-type conductivity and the second conductivity type is an n-type conductivity. The diffusion barrier region preferably has a width ranging from approximately 500 to approximately 3000 Angstroms.

According to another aspect of the invention, a method of forming a back-to-back diode resistor for an SRAM comprises the steps of:

providing a polysilicon layer having a p-type impurity;

masking the polysilicon layer to define a p-type region;

providing a diffusion inhibiting impurity into unmasked regions of the polysilicon layer;

masking the polysilicon layer to define two diffusion barrier regions adjacent to, and on opposite sides of, the p-type region; and providing an n-type impurity into unmasked regions of the polysilicon layer to produce two n-type regions adjacent respective ones of the diffusion barrier regions, the diffusion barrier regions restricting cross diffusion of the p-type and n-type impurities within the polysilicon layer.

According to yet another aspect of the invention, a back-to-back diode resistor comprises:

a polysilicon layer having two n-type regions separated by a p-type region, the polysilicon layer having interfaces between each of the n-type regions and the p-type region; and a diffusion barrier region disposed at each of the interfaces between the p-type region and the two n-type regions, the diffusion barrier regions having a selected width and containing a diffusion inhibiting impurity at a selected concentration, the p-type region being substantially void of the diffusion inhibiting impurity.

Additionally, the disclosure describes an SRAM which incorporates the above described back-to-back diode resistor.

Figure 1:
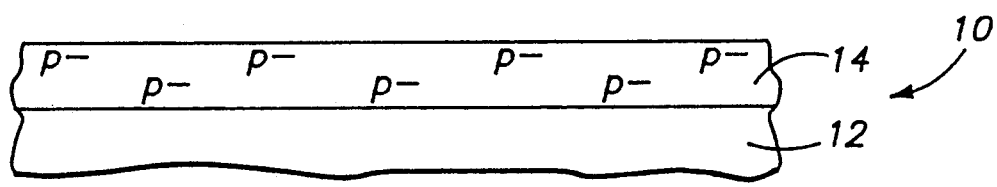
FIGS. 1–4 illustrate a prior art method for forming an n/p/n configuration in a polysilicon layer and is discussed in the Background section above.
Figure 2:
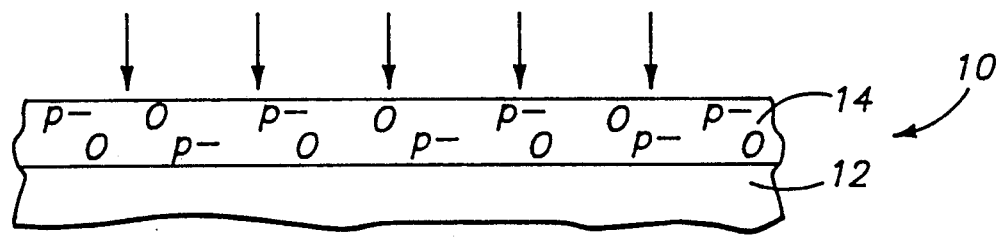
Figure 3:
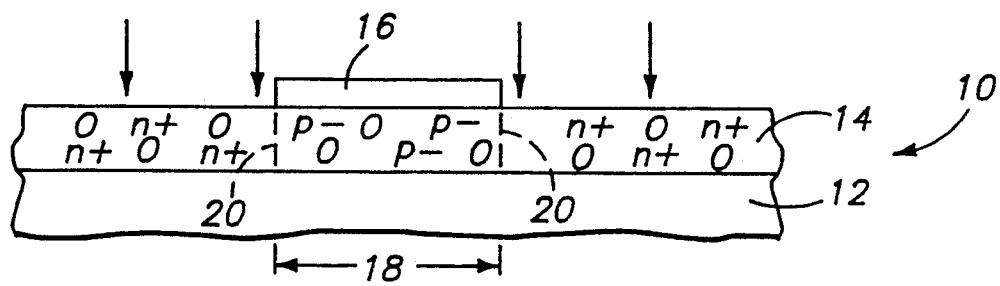
Figure 4:
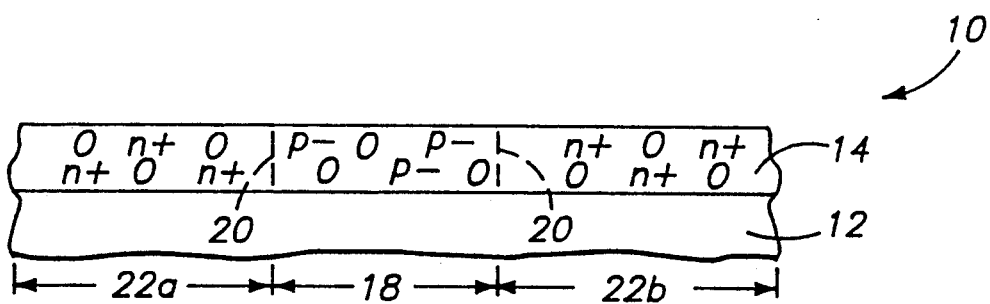
Figure 5:
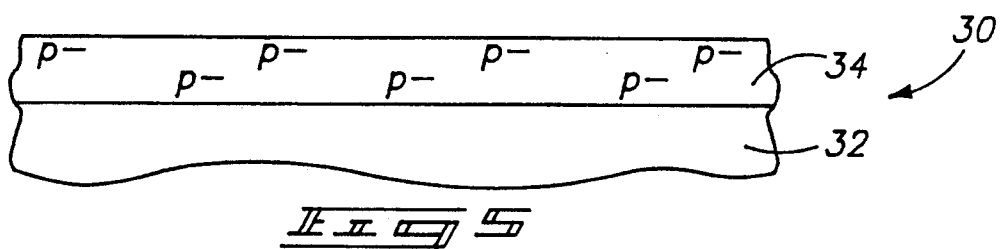
FIG. 5 diagrammatically illustrates a first processing step in a method for forming an n/p/n configuration in a polysilicon layer according to the present invention.

FIGS. 5-9 illustrate a method for minimizing diffusion of conductivity enhancing impurities from one region of a wafer into another region according to the present invention. FIG. 5 illustrates a wafer fragment 30 comprising an underlying layer 32 and an overlying polysilicon layer 34. Polysilicon layer 34 is everywhere provided with a p− impurity (typically boron) at a quantity ranging typically from approximately $1 \times 10^{13}$ atoms/cm$^2$ to approximately $7 \times 10^{13}$ atoms/cm$^2$ at 45 KeV.

Figure 6:
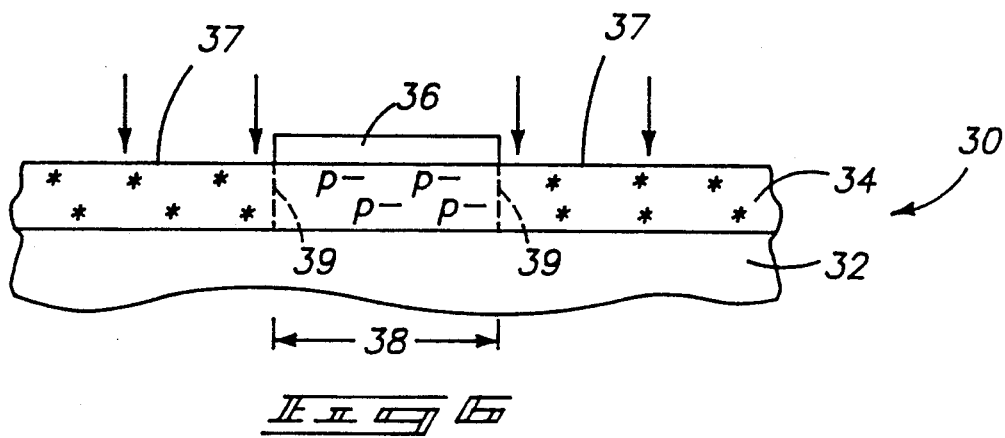
FIG. 6 diagrammatically illustrates a processing step in a method for forming an n/p/n configuration in a polysilicon layer which occurs subsequent to the step illustrated in FIG. 5.

A first mask layer is then deposited onto polysilicon layer 34 and etched to form a mask 36, as shown in FIG. 6. Mask 36 is formed preferably of an oxide (i.e., SiO$_2$) and defines a p-type region 38 and unmasked regions 37.

Next (FIG. 6), a second impurity (designated by a "*" in FIGS. 6-9) is provided into unmasked regions 37 of polysilicon layer 34. Oxide mask 36 prevents the second impurity from being provided into p-type region 38 of polysilicon layer 34, thereby defining first boundaries 39. The second impurity is preferably one or more of oxygen (O), nitrogen (N), or germanium (G), and is provided at a quantity ranging from approximately $4 \times 10^{16}$ atoms/cm$^2$ to approximately $1 \times 10^{17}$ atoms/cm$^2$ at 35 KeV. Because the second impurity is provided at a substantially greater quantity than the p-type impurity, and to promote clarity, only the second impurity is shown in the outer unmasked regions 37 of polysilicon layer 34, even though p-type impurity is present in these areas. The second impurity operates as a diffusion inhibiting impurity, as will be described in more detail below.

Figure 7:
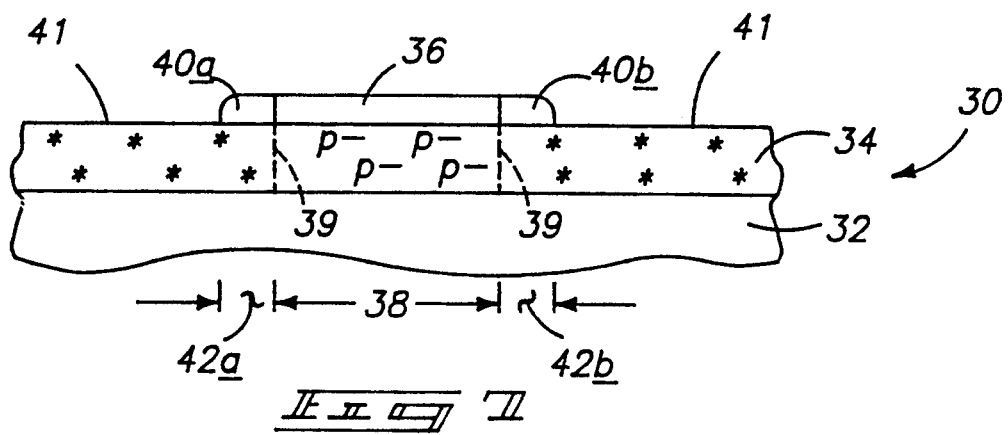
FIG. 7 diagrammatically illustrates a processing step in a method for forming an n/p/n configuration in a polysilicon layer which occurs subsequent to the step illustrated in FIG. 6.

As shown in FIG. 7, a second mask layer is deposited on polysilicon layer 34 and anisotropically etched to form spacers 40a and 40b adjacent to, and on opposite sides of, oxide mask 36. Spacers 40a and 40b are preferably formed of an oxide (i.e., SiO$_2$) and will define two barrier diffusion regions 42a and 42b of polysilicon layer 34, as will become apparent from the continuing discussion. Each of spacers 40a and 40b, and correspondingly, each of barrier regions 42a and 42b, preferably has a width ranging from approximately 500 to approximately 3000 Angstroms, with approximately 1000 Angstroms being most preferred. Oxide mask 36 and spacers 40a and 40b combine to define second unmasked regions 41 of polysilicon layer 34.

As shown in FIG. 8, an n-type impurity is provided in second unmasked regions 41 of polysilicon layer 34 to define n-type regions 44a and 44b. Oxide mask 36 and oxide spacers 40a and 40b prevent the n-type impurity from being provided into p− region 38 and diffusion barrier regions 42a and 42b of polysilicon layer 34, thereby defining second boundaries 43. Boundaries 39 and 43 thereby define diffusion barrier regions 42a and 42b. The n-type impurity is provided only in n-type regions 44a and 44b adjacent to respective diffusion barrier regions 42a and 42b.

The n-type impurity is provided at a quantity ranging from approximately $1 \times 10^{15}$ atoms/cm$^2$ to approximately $1.5 \times 10^{16}$ atoms/cm$^2$, depending upon the n-type impurity employed. Two common n-type impurities are phosphorus and arsenic. If phosphorus is used, it would typically be provided at a quantity ranging from approximately $1 \times 10^{15}$ atoms/cm$^2$ to approximately $5 \times 10^{15}$ atoms/cm$^2$ at 25 KeV. If arsenic is employed, it would typically be provided at a quantity of approximately $1.5 \times 10^{16}$ atoms/cm$^2$ at 8 KeV. The concentration of the n-type impurity (designated as "n+") is considerably greater than the concentration of the p-type impurity (designated as "p−") in polysilicon layer 34.

As shown in FIG. 9, oxide mask 36 and oxide spacers 40a and 40b are removed after the n− impurity is provided in polysilicon layer 34. As a result, polysilicon layer 34 has two n-type regions 44a and 44b separated by a p-type region 38, thereby forming the desired n+/p−/n+ configuration. Diffusion barrier regions 42a and 42b are formed of dimensions and concentrations suitable to permit normal p/n operating characteristics, while also providing a sufficient barrier to prevent cross diffusion of the p-type and n-type impurities within polysilicon layer 34.

Therefore, the method according to the invention effectively minimizes diffusion of the n-type impurity from n-type regions 44a and 44b to p-type region 38. In addition, the method according to the present invention overcomes the above cited drawback of the prior art in that p-type region 38 is not provided with a diffusion inhibiting impurity of oxygen. Thus, the method obviates any potential detrimental effect caused by having insulating material within p-type region 38.

The above described method can be employed to form back-to-back diode resistors for an SRAM cell. A back-to-back diode resistor produced according to the present invention is advantageous in that diffusion barrier regions 42a and 42b prevent cross diffusion of the p-type and n-type impurities. As a result, the back-to-back diode resistor can be scaled to a length of two microns or less.

Figure 10:
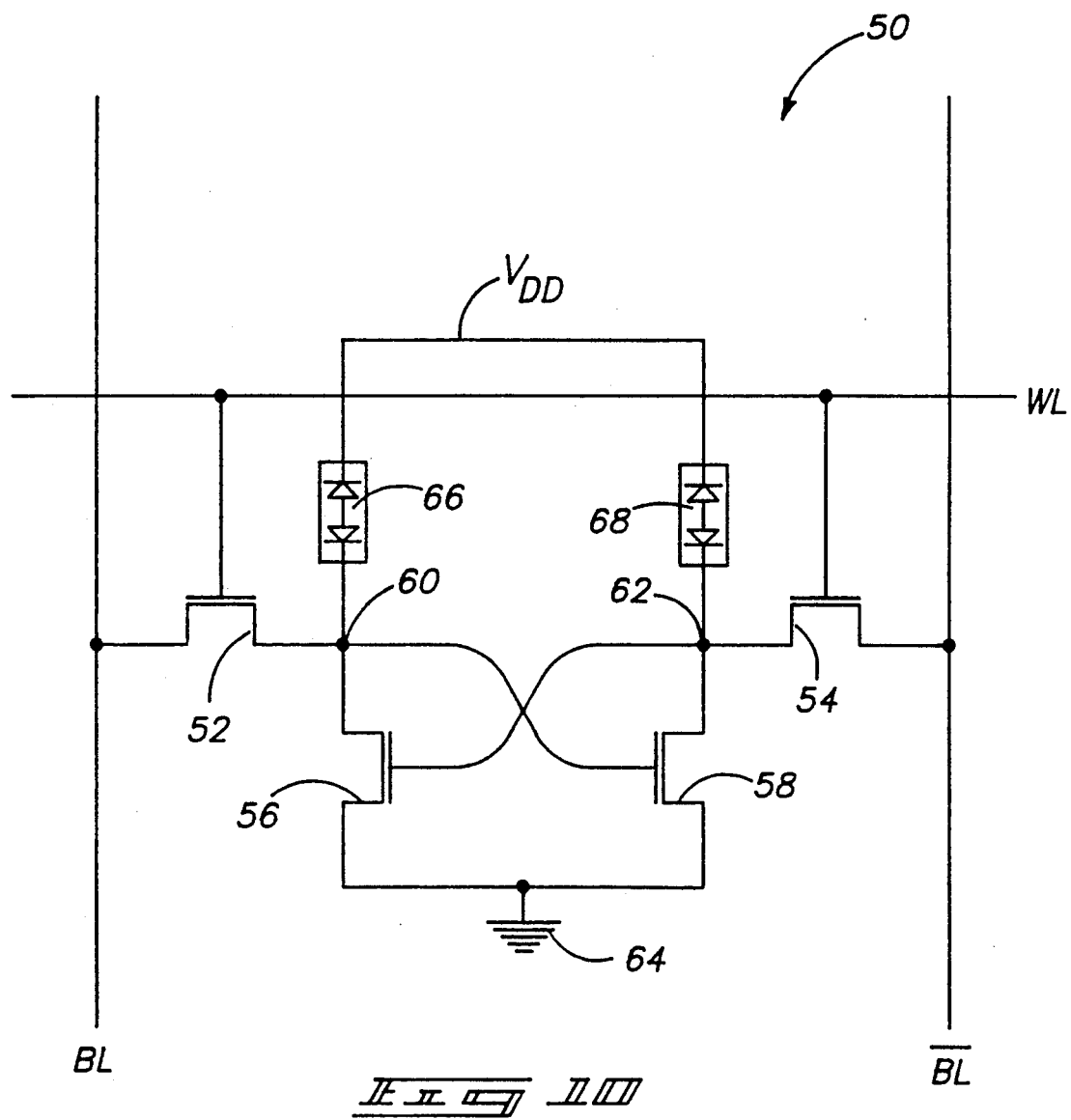
FIG. 10 shows a schematic of an SRAM cell in accordance with the invention.

FIG. 10 illustrates an SRAM cell 50, comprising two pass transistors 52 and 54 and a cross coupled pair of transistors 56 and 58. Transistor 52 has a source coupled to a bit line (BL), a drain coupled to node 60 and a gate coupled to word line (WL). Transistor 54 has a source coupled to a complementary bit line ($\overline{BL}$), a drain coupled to a node 62, and a gate coupled to word line WL. Transistor 56 has a source coupled to ground 64, a drain coupled to node 60, and a gate coupled to a node 62. Similarly, transistor 58 has a source coupled to ground 64, a drain coupled to node 62, and a gate coupled to node 60. SRAM cell 50 further comprises two back-to-back diode resistors 66 and 68, which are respectively coupled between nodes 60 and 62 and voltage source $V_{DD}$.

Each back-to-back diode resistor 66 and 68 is formed in a single polysilicon layer, such as polysilicon layer 34 shown in FIG. 9. Polysilicon layer 34 comprises two n-type regions 44a and 44b separated by a p-type region 38. The concentration of the n-type impurity in n-type regions 44a and 44b is greater than the concentration of the p-type impurity in p-type region 38. Polysilicon layer 34 further includes two diffusion barrier regions 42a and 42b disposed respectively at an interface between n-type region 44a and p-type region 38, and at an interface between n-type region 44b and p-type region 38. Each of diffusion barrier regions 42a and 42b has a width of approximately 500 Angstroms to approximately 3000 Angstroms. Preferably, this width is approximately 1000 Angstroms. Diffusion barrier regions 42a and 42b are provided with a diffusion inhibiting impurity (designated by a "*"), which is preferably one or more of nitrogen, oxygen, or germanium. P-type region 38 is substantially void of the diffusion inhibiting impurity.

The back-to-back diode resistor according to the present invention is advantageous over the prior art in that the back-to-back diode resistor may be scaled to a length of two microns or less. Accordingly, the back-to-back diode resistors the present invention may be employed is smaller scale SRAM cells. Further, unlike the prior art resistors, the conductivity/resistance characteristics are not detrimentally impacted because p-type region 38 is substantially void of the diffusion inhibiting impurity.

In compliance with the statute, the invention has been described in language more or less specific as to structural and methodical features. The invention is not, however, limited to the specific features shown and described, since the means and construction herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A method of forming a back-to-back diode resistor for an SRAM comprising the steps of:
    providing a polysilicon layer having a p-type impurity;
    masking the polysilicon layer to define a p-type region;
    providing a diffusion inhibiting impurity into unmasked regions of the polysilicon layer;
    masking the polysilicon layer to define two diffusion barrier regions adjacent to, and on opposite sides of, the p-type region; and
    providing an n-type impurity into unmasked regions of the polysilicon layer to produce two n-type regions adjacent respective ones of the diffusion barrier regions, the diffusion barrier regions restricting cross diffusion of the p-type and n-type impurities within the polysilicon layer.

2. A method according to claim 1 wherein the diffusion inhibiting impurity is selected from the group consisting of nitrogen, oxygen, and germanium.

3. A method according to claim 1 wherein each of the diffusion barrier regions has a width ranging from approximately 500 to approximately 3000 Angstroms.

4. A method according to claim 1 wherein the diffusion inhibiting impurity is selected from the group consisting of nitrogen, oxygen, and germanium; and each of the diffusion barrier regions has a width ranging from approximately 500 to approximately 3000 Angstroms.

5. A method according to claim 1 wherein the diffusion inhibiting impurity is selected from the group consisting of nitrogen, oxygen, and germanium; and each of the diffusion barrier regions has a width of approximately 1000 Angstroms.

* * * * *